(12) United States Patent
Liu et al.

(10) Patent No.: US 8,680,519 B1
(45) Date of Patent: Mar. 25, 2014

(54) CUTTABLE ORGANIC LIGHT EMITTING DIODE LIGHT SOURCE DEVICE WITH WIRELESS POWER TRANSMISSION

(71) Applicant: Industrial Technology Research Institute, Hsinchu Hsien (TW)

(72) Inventors: Ming-Chung Liu, Hsinchu (TW); Jung-Yu Li, Hsinchu (TW); Yi-Ping Lin, Hsinchu (TW); Li-Ling Lee, Hsinchu (TW)

(73) Assignee: Industrial Technology Research Institute, Chutung Township, Hsinchu County (TW)

( * ) Notice: Subject to any disclaimer, the term of this patent is extended or adjusted under 35 U.S.C. 154(b) by 0 days.

(21) Appl. No.: 13/707,269

(22) Filed: Dec. 6, 2012

(30) Foreign Application Priority Data

Sep. 7, 2012 (TW) .............................. 101132670 A

(51) Int. Cl.
*H01L 51/52* (2006.01)
*H01L 51/54* (2006.01)

(52) U.S. Cl.
USPC ........... 257/40; 257/88; 257/98; 257/E51.019

(58) Field of Classification Search
None
See application file for complete search history.

(56) References Cited

U.S. PATENT DOCUMENTS

| | | | |
|---|---|---|---|
| 6,870,196 B2 | 3/2005 | Strip | |
| 7,999,463 B2 | 8/2011 | Nomura | |
| 8,115,383 B2 | 2/2012 | Cok | |
| 8,148,725 B2 | 4/2012 | Chen | |
| 2002/0063533 A1 | 5/2002 | Swallow | |
| 2002/0190661 A1 | 12/2002 | Duggal | |
| 2003/0010985 A1 | 1/2003 | Shen | |
| 2004/0032220 A1 | 2/2004 | Cok | |
| 2005/0174064 A1 | 8/2005 | Agostinelli | |
| 2006/0125410 A1 | 6/2006 | Duggal | |
| 2008/0067527 A1* | 3/2008 | Daniels et al. | 257/88 |
| 2012/0012868 A1* | 1/2012 | Chang et al. | 257/91 |
| 2012/0138918 A1* | 6/2012 | Naraoka et al. | 257/40 |
| 2012/0168801 A1* | 7/2012 | Xuan et al. | 257/98 |

(Continued)

FOREIGN PATENT DOCUMENTS

| | | |
|---|---|---|
| TW | 200607382 | 2/2006 |
| TW | 200730004 | 8/2007 |

OTHER PUBLICATIONS

"Cutting LCD Panel Power with LED Driver ICs", Davis, S.A.M.—Power Electronics Technology, Aug. 1, 2009, pp. 14-17, vol. 35.

(Continued)

*Primary Examiner* — Thomas L Dickey
*Assistant Examiner* — Joseph Schoenholtz
(74) *Attorney, Agent, or Firm* — Muncy, Geissler, Olds & Lowe, P.C.

(57) ABSTRACT

A cuttable organic light emitting diode (OLED) light source device is provided, including a lower substrate, a plurality of OLED modules disposed on the lower substrate and arranged in a matrix, a plurality of sensing electrodes disposed on respective OLED modules for sensing an external magnetic field in order to provide power to the OLED modules, and an upper substrate disposed on the OLED modules and the sensing electrodes. The present disclosure independently provides power to each OLED module through the sensing electrodes, and allows the cuttable OLED light source device with wireless transmission to arbitrarily cut into different shapes, so that the service life and light emitting performance are not affected by the cutting.

20 Claims, 11 Drawing Sheets

(56) References Cited

U.S. PATENT DOCUMENTS

2012/0280217 A1* 11/2012 Matsuura et al. ............... 257/40
2012/0286298 A1   11/2012 Pang
2012/0326189 A1* 12/2012 Lee et al. .................... 257/98
2013/0199601 A1*  8/2013 Vardeny et al. ............. 136/255

OTHER PUBLICATIONS

"Mechanical Modeling of Flexible OLED Devices", Chang, Chien-Jung-Organic Electronics: Physics, materials, applications, Jul. 9, 2009, pp. 1268-1274, vol. 10.

"Second Generation OLED Devices and Systems: Inline Evaporation, Highly Efficient OLED Devices, and Novel Driver/Controller ASICs", Joerg Amelung, Proceedings of SPIE—The International Society for Optical Engineering, 2005, pp. 596107-1-596107-11, vol. 5961.

"Fabrication and Design of Various Dimensions of Multi-step Aspherical Microlens Arrays for OLED Package", PAN, Optics Communications, 2011, pp. 3323-3330, vol. 284, N. 13.

Cok et al., "60.3; AMOLED Displays using Transfer-Printed Integrated Circuits," 60.3 SID 10 Digest, 2010, pp. 902-904.

PhotonicRoadSME, R&D Report on Organic Semiconductors/OLEDs, 2009, downloaded from URL http://www.photonicroad.eu/upoad/PhotonicRoadSME_RD%20report%20OLEDs.pdf on Oct. 29, 2013.

Daniel, "Printed Electronics: Technologies, Challenges and Applications," International Workshop on Flexible and Printed Electronics (IWFPE 10), Sep. 8-10, 2010, Muju Resort, Korea.

Bower et al., "Active Matrix OLED Display Backplanes using Transfer-Printed Microscale Integrated Circuits," IEEE Electronics Component and Technology Conference, 2010, pp. 1339-1343.

* cited by examiner

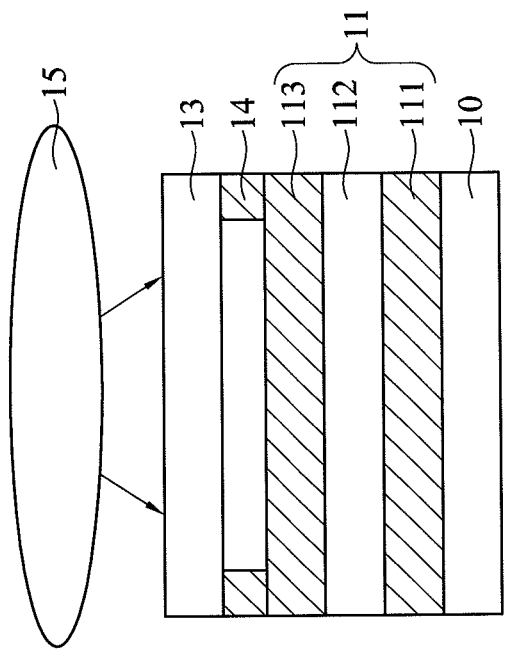
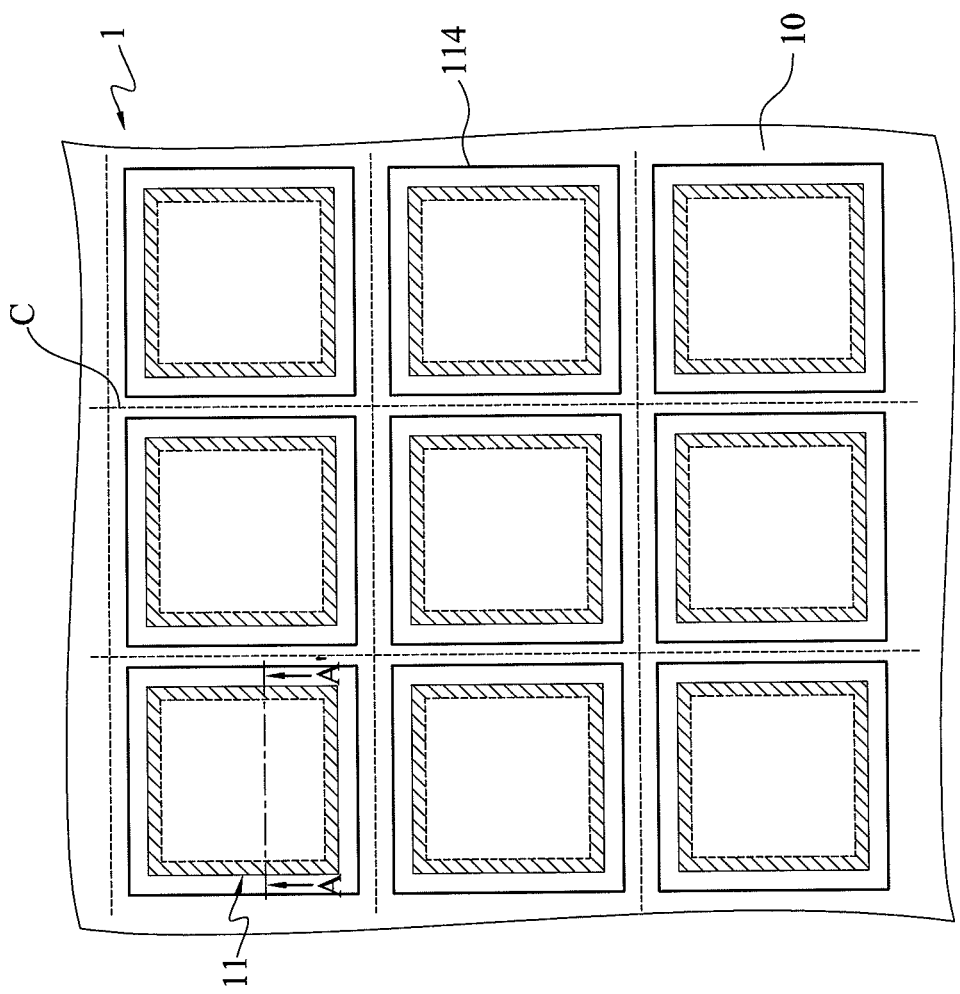
FIG. 1A
FIG. 1B

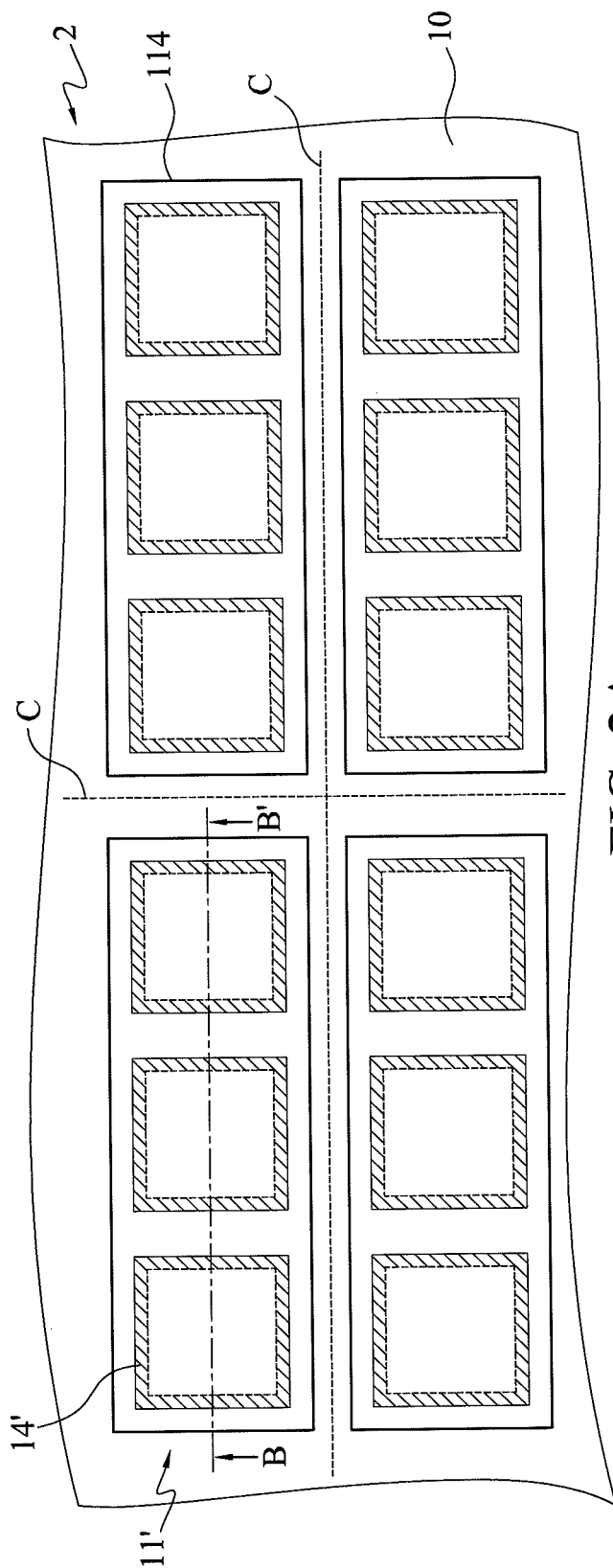
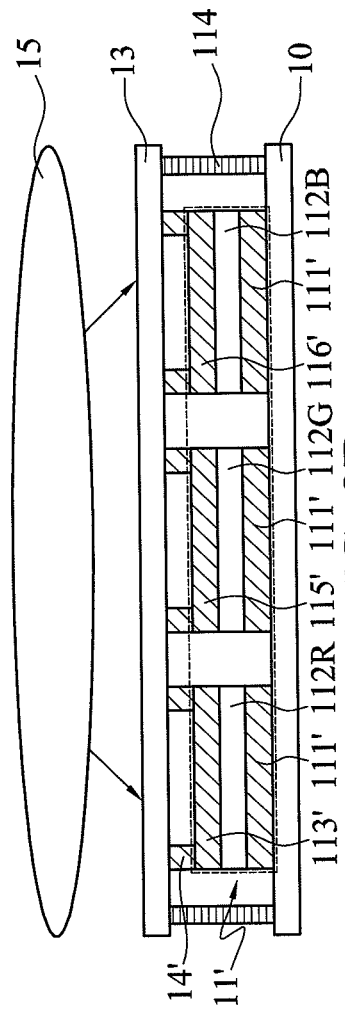
FIG. 2A
FIG. 2B

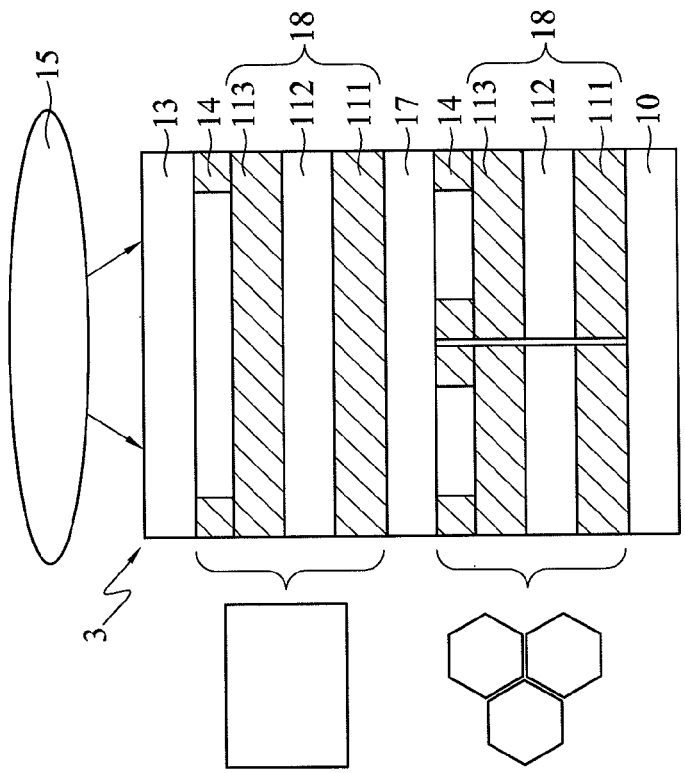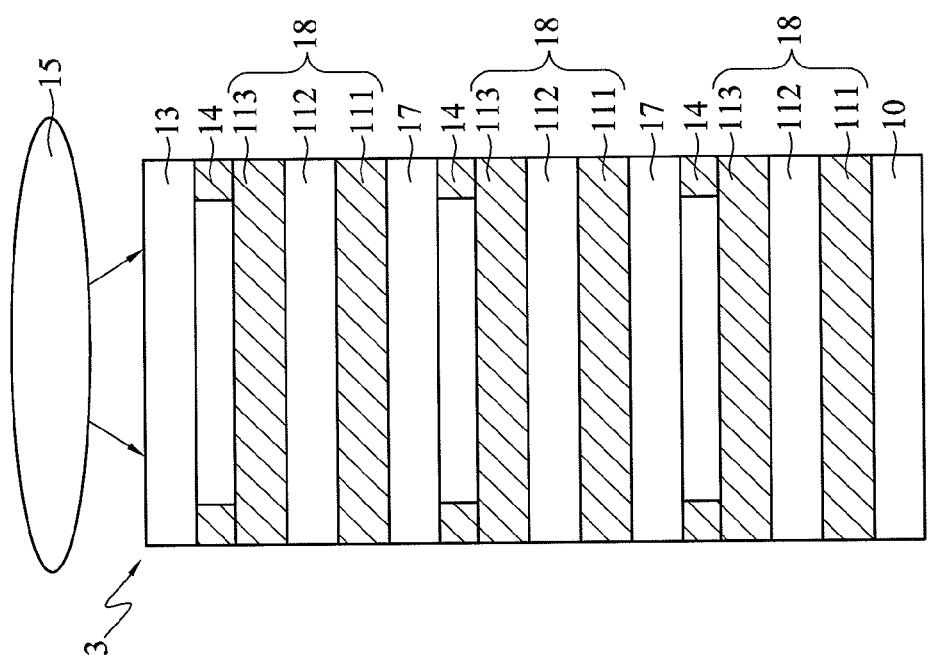

CUTTABLE ORGANIC LIGHT EMITTING DIODE LIGHT SOURCE DEVICE WITH WIRELESS POWER TRANSMISSION

CROSS-REFERENCE TO RELATED APPLICATIONS

This application claimed priority to Taiwanese Patent Application No. 101132670, filed on Sep. 7, 2012. The entirety of the above-mentioned patent application is hereby incorporated by reference herein and made a part of this specification.

BACKGROUND

1. Technical Field

The present disclosure relates to light source devices, and, more particularly, to a cuttable organic light emitting diode (OLED) light source device with wireless power transmission.

2. Description of Related Art

Organic light emitting diode (OLED) releases energy in the form of light through the electron-hole recombination process between the conduction band and the valence band. Therefore, a polymer organic thin film of semiconductor material properties can be used as the transport layers for electrons and holes and the light-emitting layer for electron-hole recombination. OLEDs are usually made from the thin-film process, while light emitting diodes (LEDs) require complicated epitaxial process to produce P- and N-type electron and hole transport layers. Accordingly, only rigid opaque substrates (e.g., gallium arsenide, silicon carbide (SiC) or sapphire) can be chosen as the substrate material of the LEDs. In addition to the generally opaque rigid substrates, the substrates of OLEDs can also be selected from transparent glass substrates, and even extended to flexible plastic substrates. In addition, the OLEDs are self-luminous, and therefore do not require a backlight module and a color filter. This can further reduce the thickness of the diode modules. In addition to being thin and flexible and with low glare, special characteristics such as high color rendering and full spectrum have made OLEDs the focus of attention for the next generation of lighting technology.

However, most of the OLED lighting devices have fixed specifications, such as fixed sizes and shapes. Light source devices with fixed specifications meet users's needs under certain circumstances, such as in certain corner regions of buildings or spaces with special shapes, or under circumstances in which flexible changes based on indoor spaces are needed. Therefore, the existing lighting equipment cannot provide enough flexibility in the product form factors, resulting in lighting design or application must accommodate the specifications of the existing lighting equipment.

SUMMARY

The present disclosure provides a cuttable organic light emitting diode (OLED) light source device with wireless power transmission, which includes: a lower substrate; a plurality of OLED modules disposed on the lower substrate and arranged in a matrix, each of the OLED modules including a first electrode layer disposed on the lower substrate, an OLED chip disposed on the first electrode layer, a second electrode layer disposed on the OLED chip, and a sensing electrode electrically connected to the first electrode layer or the second electrode layer for sensing an external magnetic field to provide power to the OLED modules; and an upper substrate disposed on the OLED modules and the sensing electrodes.

In an embodiment, each of the OLED modules includes a package frame structure such that the OLED module has an independent package boundary, so that the service life of each OLED module is not affected after cutting.

The present disclosure also provides a cuttable OLED light source device with wireless power transmission, which includes: a lower substrate; a plurality of OLED modules disposed on the lower substrate and arranged in a matrix, each of the OLED modules including a first electrode layer disposed on the lower substrate, a first color OLED chip disposed on the first electrode layer, a second electrode layer disposed on the first color OLED chip, a second color OLED chip disposed on the first electrode layer; a third electrode layer disposed on the second color OLED chip, a third color OLED chip disposed on the first electrode layer, a fourth electrode layer disposed on the third color OLED chip, and three sensing electrodes electrically connected to the second electrode layer, the third electrode layer, and the fourth electrode layer for sensing an external magnetic field to provide power to the first color OLED chip, the second color OLED chip, and the third color OLED chip, respectively; and an upper substrate disposed on the OLED modules and the sensing electrodes.

In an embodiment, each of the OLED modules includes a package frame structure such that each OLED module has an independent package boundary, so that the service life of each OLED module is not affected after cutting.

The present disclosure further provides a cuttable OLED light source device with wireless power transmission, which includes: a lower substrate; a plurality of light source layers disposed on the lower substrate and stacked on one another in a direction perpendicular to a surface of the lower substrate, wherein each of the light source layers includes a plurality of OLED modules arranged in a matrix, and each of the OLED modules includes a first electrode layer disposed on the lower substrate, an OLED chip disposed on the first electrode layer, and a second electrode layer disposed on the OLED chip; a partition substrate disposed between the light source layers to separate and connect adjacent light source layers; a plurality of sensing electrodes disposed on respective OLED modules and electrically connected to the first electrode layer or the second electrode layer for sensing an external magnetic field to provide power to the OLED modules; and an upper substrate joined on top of the plurality of OLED modules and the sensing electrodes.

In an embodiment, each of the OLED modules includes a package frame structure such that the OLED module has an independent package boundary, so that the service life of each OLED module is not affected after cutting.

BRIEF DESCRIPTION OF DRAWINGS

The present disclosure can be more fully understood by reading the following detailed description of the embodiments, with reference made to the accompanying drawings, wherein:

FIG. 1A is a schematic diagram depicting a top view of a cuttable OLED light source device with wireless power transmission in accordance with an embodiment of the present disclosure;

FIG. 1B is a cross-sectional schematic diagram along a line A-A' shown in FIG. 1A;

FIG. 2A is a schematic diagram depicting a top view of a cuttable OLED light source device with wireless power transmission in accordance with another embodiment of the present disclosure;

FIG. 2B is a cross-sectional schematic diagram along a line B-B' shown in FIG. 2A;

FIGS. 3A to 3E are cross-sectional schematic diagrams illustrating a cuttable OLED light source device with wireless power transmission in accordance with still another embodiment of the present disclosure.

DETAILED DESCRIPTION

Figure 1C:
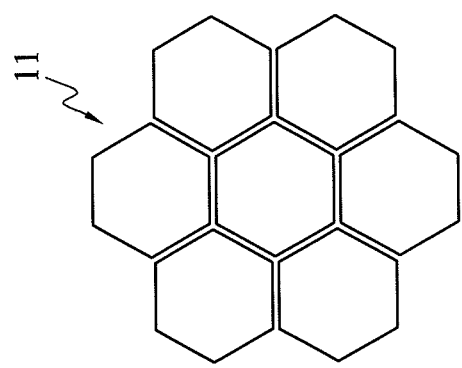
FIGS. 1C to 1E are schematic diagrams illustrating the arrangement of matrices of the cuttable OLED light source device with wireless power transmission in accordance with an embodiment of the present disclosure.

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

FIG. 1A is a schematic diagram depicting a top view of a cuttable organic light emitting diode (OLED) light source device 1 with wireless power transmission in accordance with a first embodiment of the present disclosure, and FIG. 1B is a cross-sectional schematic diagram along a line A-A' shown in FIG. 1A. The cuttable OLED light source device 1 includes a lower substrate 10, a plurality of OLED modules 11, a plurality of sensing electrodes 14, and an upper substrate 13.

The OLED modules 11 are disposed on the lower substrate 10 and are arranged in a matrix. Each of the OLED modules 11 includes a first electrode layer 111 disposed on the lower substrate 10, an OLED chip 112 disposed on the first electrode layer 111, and a second electrode layer 113 disposed on the OLED chip 112.

Figure 1D:
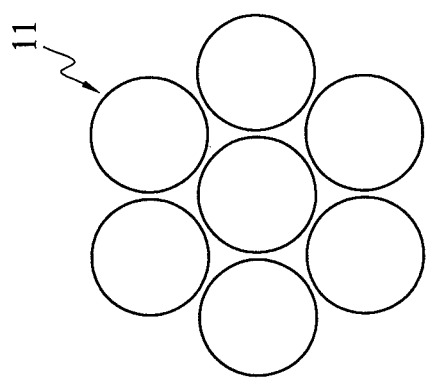
Figure 1E:
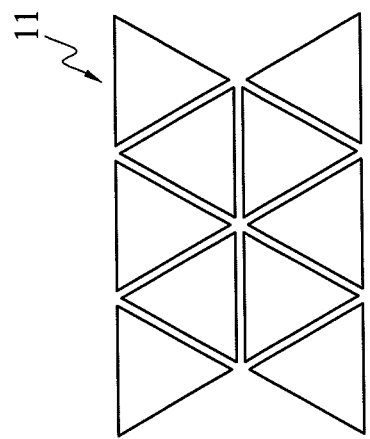

In an embodiment, the cuttable OLED light source device 1 is arranged in other types of matrices, such as those shown in FIGS. 1C to 1E.

In an embodiment, the OLED chip 112 is disposed by sequentially stacking an electron injection layer, an electron transport layer, a light emitting layer, a hole transport layer, and a hole injection layer together.

The first electrode layer 111 can be used as the cathode for the OLED modules 11, and the second electrode layer 113 can be used as the anode for the OLED modules 11.

Each of the OLED modules 11 may further include a package frame structure 114 so that the OLED module 11 can have an independent package boundary. In an embodiment, the package frame structure 114 is made of an UV-cured encapsulant or sealant. In addition, the UV-cured encapsulant or sealant can further bond the lower substrate 10 and the upper substrate 13.

The sensing electrodes 14 are disposed on respective OLED modules 11 and electrically connected to the second electrode layer 113 for sensing an external magnetic field 15 in order to provide power to the OLED modules 11.

In an embodiment, the sensing electrodes 14 are ring-shaped, dot-shaped or lattice-like sensing electrodes, and are made of metals, such as aluminum, copper, gold, silver, iron, cobalt, nickel, titanium, tantalum, molybdenum, platinum, or zinc, or other transparent conductive materials, such as, indium tin oxide (ITO), fluorine-doped tin oxide (FTO), indium zinc oxide (IZO), aluminum doped zinc oxide (AZO) or other types of transparent conductive oxide (TCO). The present disclosure is not limited to these, but can use any materials and shapes of sensing electrodes for wireless power provision.

Figure 1H:
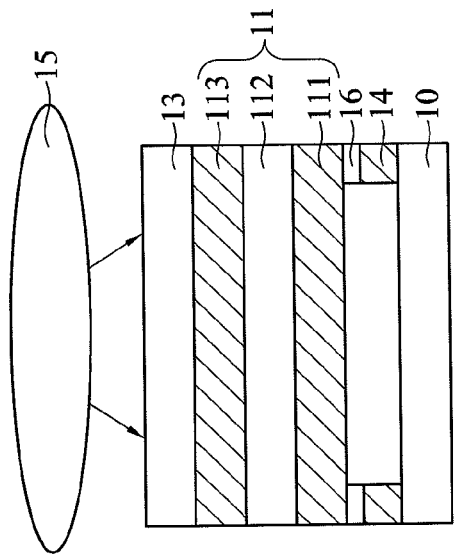
FIGS. 1F to 1H are cross-sectional schematic diagram depicting the cuttable OLED light source device with wireless power transmission of the present disclosure.
Figure 1G:
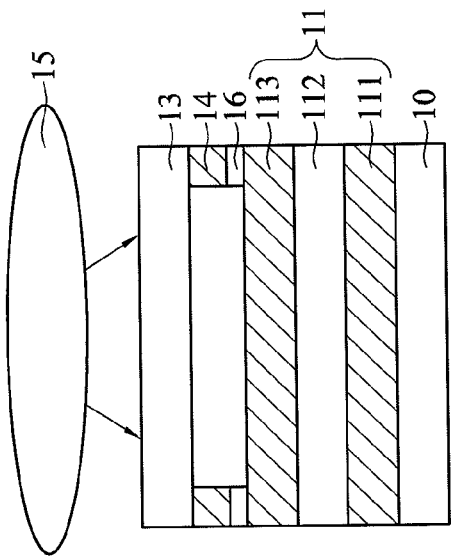
Figure 1F:
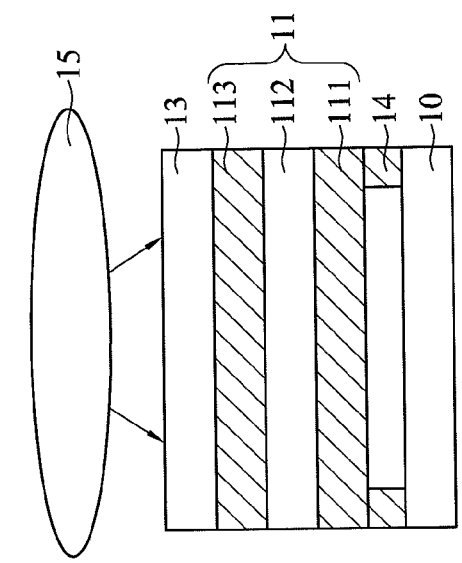
Figure 1J:
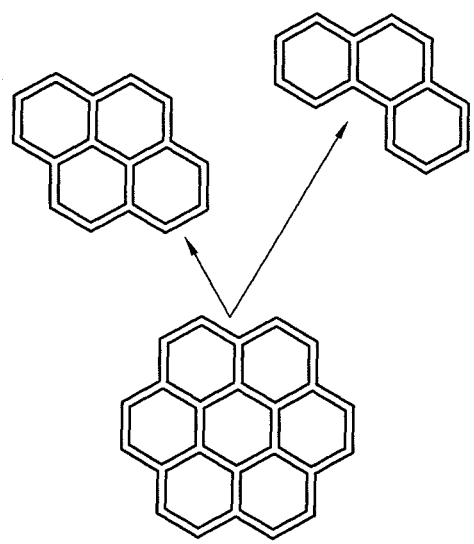
FIGS. 1I to 1L are schematic diagrams depicting cutting of the cuttable OLED light source device with wireless power transmission of the present disclosure.
Figure 1I:
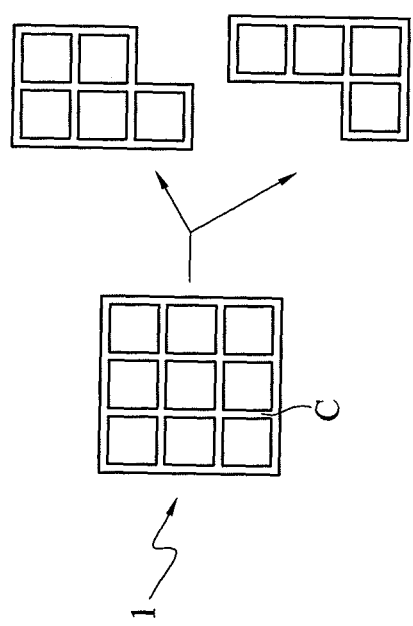
Figure 1L:
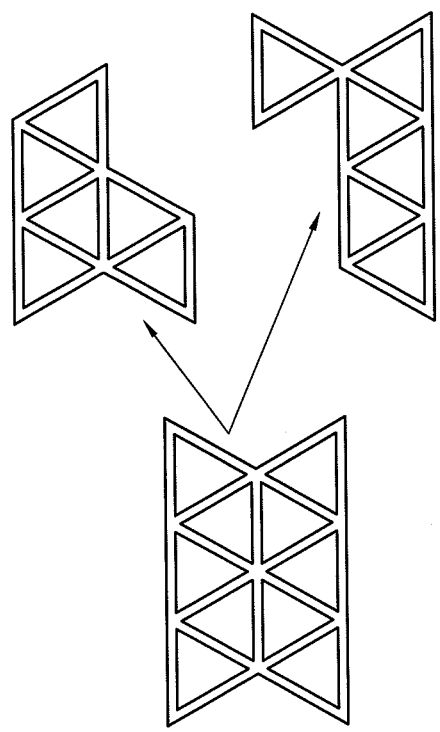
Figure 1K:
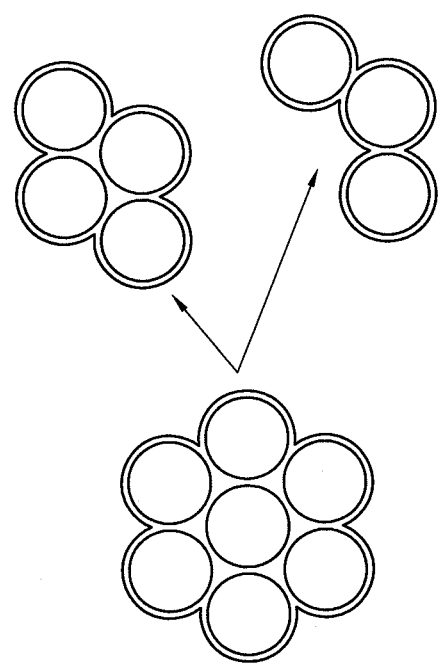

In another embodiment, as shown in FIG. 1F, the sensing electrodes 14 can be disposed on respective OLED modules 11 and electrically connected to the first electrode layer 111.

In still another embodiment, as shown in FIGS. 1G and 1H, the cuttable OLED light source device 1 further includes an insulating layer 16. The insulating layer 16 is disposed between the sensing electrodes 14 and the first electrode layer 111 or the second electrode layer 113, so as to insulate the first electrode layer 111 from the second electrode layer 113 when the sensing electrodes 14 and the first electrode layer 11 or the second electrode layer 113 are made of the same material, so as to increase the electrical characteristics.

In an embodiment, at least one of the upper substrate 13 and the lower substrate 10 is made of glass or plastic, and may have a water-repellent layer and a gas barrier layer, wherein the water-repellent layer and the gas barrier layer may be an aluminum oxide layer ($Al_2O_3$) deposited by Atomic Layer Deposition (ALD) method.

In an embodiment, at least one of the upper substrate 13 and the lower substrate 10 has cutting lines C thereon. The cutting lines C are disposed on the upper substrate 13 and/or lower substrate 10 and correspond in position to the peripheries of the OLED modules 11 and are used as the baseline for cutting.

As shown in FIGS. 1I to 1L, the cuttable OLED light source device 1 can be cut arbitrarily along the cutting lines C.

Figure 1M:
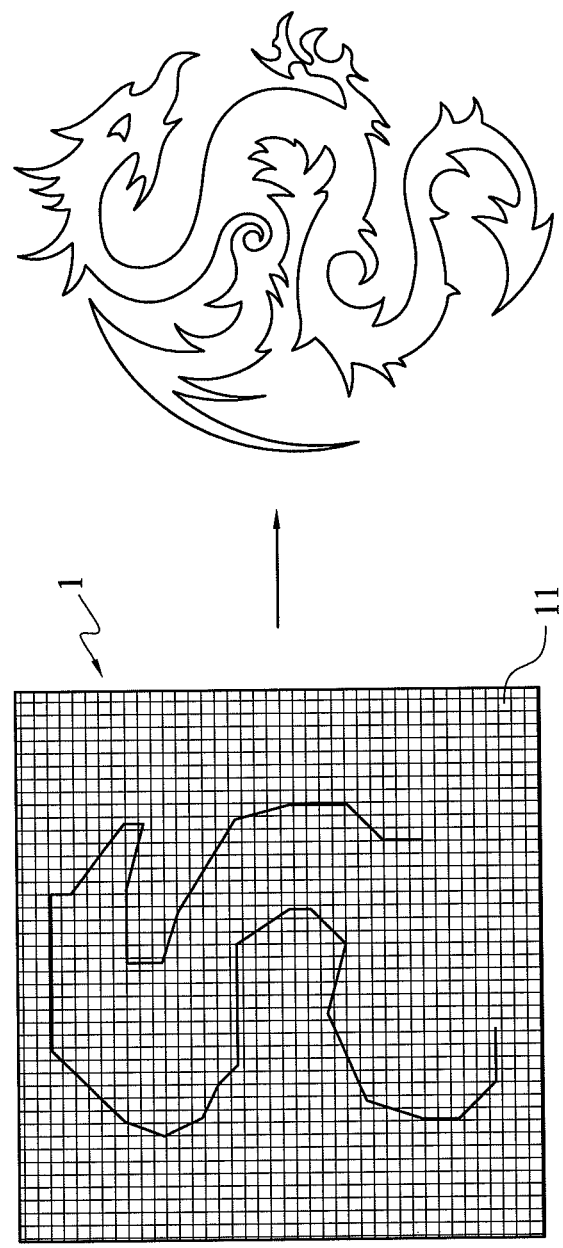
FIG. 1M is a schematic diagram illustrating cutting of the cuttable OLED light source device with wireless power transmission of the present disclosure.

As shown in FIG. 1M, if a finer pattern is to be cut out, each of the OLED modules 11 has to be miniaturized to have a smaller area. With this, the tolerance of cutting error also becomes narrower, such that at the time of cutting, some of the OLED modules 11 may be inevitably damaged at the cutting borders. However, the size of the OLED modules 11 has been reduced to an extent that damage to some of the OLED modules 11 is not noticeable to the human eyes, and therefore has no impact on the overall light emitting effect and appearance.

FIG. 2A is a schematic diagram depicting a top view of a cuttable OLED light source device 2 with wireless power transmission in accordance with a second embodiment of the present disclosure, and FIG. 2B is a cross-sectional schematic diagram along a line B-B' shown in FIG. 2A. The cuttable OLED light source device 2 includes the lower substrate 10, a plurality of OLED modules 11', three sensing electrodes 14', and the upper substrate 13. The second embodiment differs from the first embodiment in that each of the OLED modules 11' includes a first electrode layer 111', a first color OLED chip 112R, a second color OLED chip 112G, and a third color OLED chip 112B.

The first electrode layer 111' is disposed on the lower substrate 10. The first color OLED chip 112R is disposed on the first electrode layer 111'. The second electrode layer 113' is disposed on the first color OLED chip 112R. The second color OLED chip 112G is disposed on the first electrode layer 111'. The third electrode layer 115' is disposed on the second color OLED chip 112G. The third color OLED chip 112B is disposed on the first electrode layer 111'. The fourth electrode layer 116' is disposed on the third color OLED chip 112B. The three sensing electrodes 14' are electrically connected to the second electrode layer 113', the third electrode layer 115', and the fourth electrode layer 116' for sensing an external magnetic field to provide power to the first color OLED chip 112R, the second color OLED chip 112G, and the third color OLED chip 112B, respectively.

In an embodiment, three insulating layers are disposed between the three sensing electrodes 14' and the second electrode layer 113', the third electrode layer 115', and the fourth electrode layer 116', respectively, similar to the first embodiment.

In an embodiment, the first color OLED chip 112R, the second color OLED chip 112G, and the third color OLED chip 112B are a red OLED chip, a green OLED chip, and a blue OLED chip, respectively.

In an embodiment, the OLED module 11' can emit three colors of light, including red light, blue light, and green light, and the intensities of these lights can be individually controlled so that the light emitting module exhibit different shades and color temperatures, wherein the red, green, and blue OLED chips are each disposed by sequentially stacking an electron injection layer, an electron transport layer, a light emitting layer, a hole transport layer and a hole injection layer together. The electron injection layer of the red OLED chip 112R is joined with the first electrode layer 111', and the hole injection layer is joined with the second electrode layer 113'. The electron injection layer of the green OLED chip 112G is joined with the first electrode layer 111', and the hole injection layer is joined with the third electrode layer 115'. The electron injection layer of the blue OLED chip 112B is joined with the first electrode layer 111', and the hole injection layer is joined with the fourth electrode layer 116'.

Figure 2E:
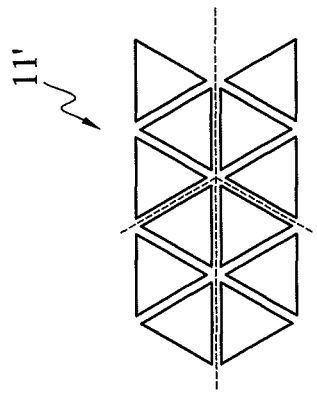
FIGS. 2C to 2E are schematic diagrams illustrating the arrangement of matrices of the cuttable OLED light source device with wireless power transmission in accordance with an embodiment of the present disclosure.
Figure 2D:
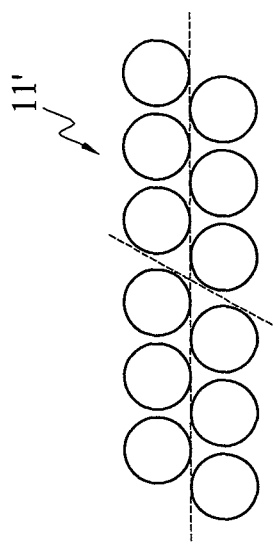
Figure 2C:
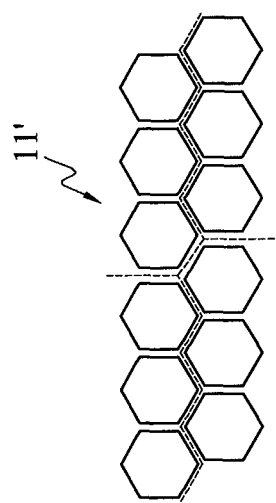

Similar to the first embodiment, the cuttable OLED light source device 2 of the second embodiment can be arranged in other types of matrices, such as those shown in FIGS. 2C to 2E.

Figure 3A:
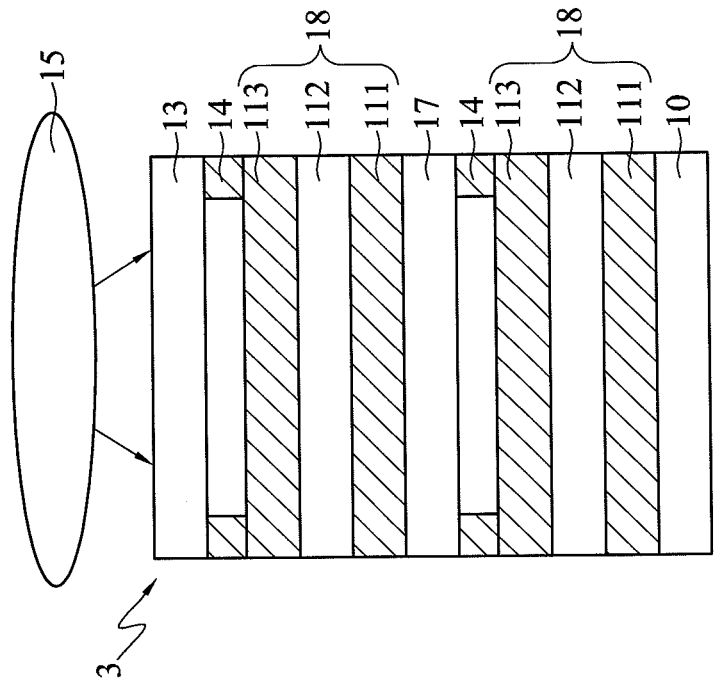
Figure 3B:
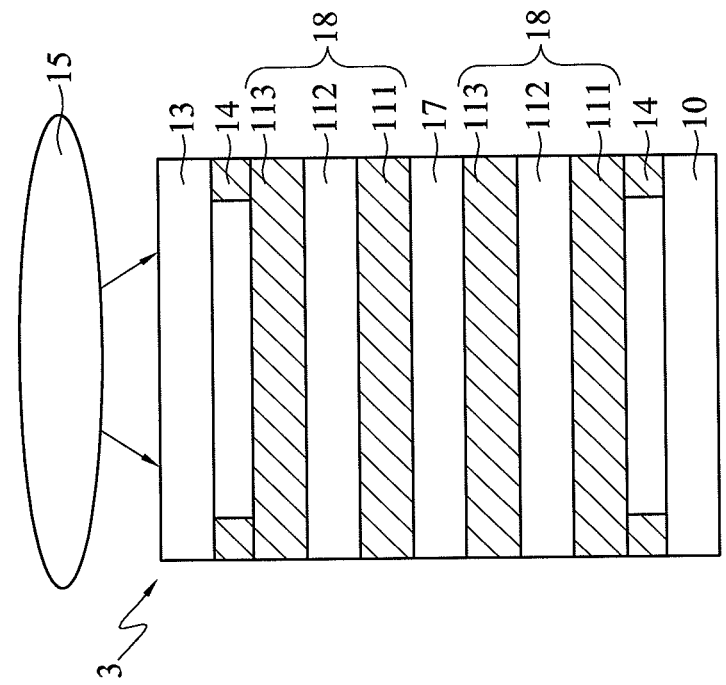
Figure 3E:
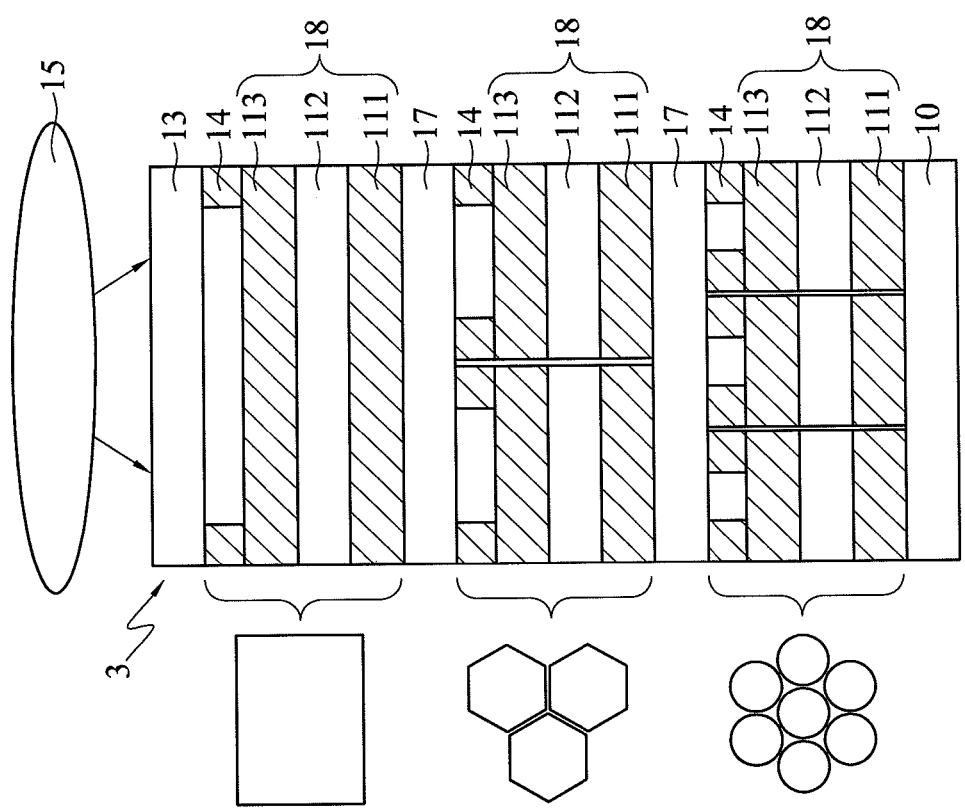

FIG. 3A is a schematic diagram depicting a cross-sectional view of a cuttable OLED light source device 3 with wireless power transmission in accordance with a third embodiment of the present disclosure. The cuttable OLED light source device 3 includes the lower substrate 10, a plurality of light source layers 18, a partition substrate 17, the plurality of sensing electrodes 14, and the upper substrate 13. The third embodiment differs from the first embodiment in that the light source layers 18 are disposed on the lower substrate 10 and are stacked on one another in a direction perpendicular to the surface of the lower substrate 10. Each of the light source layers 18 has the plurality of OLED modules 11 arranged in a matrix, and the partition substrate 17 is disposed between the light source layers 18 to divide and connect adjacent light source layers 18.

In an embodiment, as shown in FIGS. 3B to 3E, the OLED modules 11 in the light source layers 18 are in the same or different matrix arrangement and have the same or different shape and size. The OLED modules 11 in different light source layers 18 or the OLED modules 11 in some light source layers 18 can be driven by the frequency, the magnitude and the direction of the wireless sensing, such that they exhibit one, two or more types of colors, shapes and distribution densities, so the overall cuttable OLED light source device with wireless power transmission 3 may present different kinds of visual effects (e.g., color, grayscale, etc.).

In summary, the cuttable OLED light source device with wireless power transmission of the present disclosure utilizes the design of sensing electrodes to enable the OLED light source device to be arbitrarily cut into shapes, while preventing the OLED modules from being damaged due to the ingress of moisture, thereby significantly improving the designs and application range of the OLED light source device.

What is claimed is:

1. A cuttable organic light emitting diode (OLED) light source device, comprising:
   a lower substrate;
   a plurality of OLED modules disposed on the lower substrate and arranged in a matrix, each of the OLED modules including:
      a first electrode layer disposed on the lower substrate;
      an OLED chip disposed on the first electrode layer;
      a second electrode layer disposed on the OLED chip; and
      a sensing electrode disposed on and electrically connected to the first electrode layers or the second electrode layers for sensing an external magnetic field to provide power to the OLED module; and
   an upper substrate disposed on the OLED modules.

2. The cuttable OLED light source device with of claim 1, wherein at least one of the sensing electrode is ring-shaped, dot-shaped or lattice-like shaped.

3. The cuttable OLED light source device of claim 1, wherein each of the OLED modules further comprises an insulating layer disposed between the sensing electrode and the first or the second electrode layer.

4. The cuttable OLED light source device of claim 1, wherein each of the OLED modules includes a package frame structure such that the module has an independent package boundary.

5. The cuttable OLED light source device of claim 1, further comprising cutting lines disposed on at least one of the upper substrate and the lower substrate and corresponding in position to peripheries of the OLED modules.

6. The cuttable OLED light source device of claim 1, wherein at least one of the OLED chip comprises an electron injection layer, an electron transport layer, a light emitting layer, a hole transport layer, and a hole injection layer stacked on one another sequentially, wherein the electron injection layer is joined with the first electrode layer, and the hole injection layer is joined with the second electrode layer.

7. A cuttable OLED light source device, comprising:
   a lower substrate;
   a plurality of OLED modules disposed on the lower substrate and arranged in a matrix, each of the OLED modules including:
      a first electrode layer disposed on the lower substrate;
      a first color OLED chip disposed on the first electrode layer;
      a second electrode layer disposed on the first color OLED chip;
      a second color OLED chip disposed on the first electrode layer;
      a third electrode layer disposed on the second color OLED chip;
      a third color OLED chip disposed on the first electrode layer;
      a fourth electrode layer disposed on the third color OLED chip; and
      three sensing electrodes electrically connected to the second electrode layer, the third electrode layer, and the fourth electrode layer for sensing an external magnetic field to provide power to the first color OLED chip, the second color OLED chip, and the third color OLED chip, respectively; and an upper substrate disposed on the OLED modules and the sensing electrodes.

8. The cuttable OLED light source device of claim 7, wherein at least one of the sensing electrodes is a ring-shaped, dot-shaped or lattice-like sensing electrode.

9. The cuttable OLED light source device of claim 7, further comprising three insulating layers disposed between the sensing electrode and the second, the third and the fourth electrode layers, respectively.

10. The cuttable OLED light source device of claim 7, wherein the first color OLED chip is a red OLED chip, the second color OLED chip is a blue OLED chip, and the third color OLED chip is a green OLED chip.

11. The cuttable OLED light source device of claim 7, wherein each of the OLED modules includes a package frame structure such that the OLED module has an independent package boundary.

12. The cuttable OLED light source device of claim 7, further comprising cutting lines disposed on at least one of the upper substrate and the lower substrate and corresponding in position to peripheries of the OLED modules.

13. The cuttable OLED light source device of claim 7, wherein each of the first color, the second color, and the third color OLED chips comprises an electron injection layer, an electron transport layer, a light emitting layer, a hole transport layer, and a hole injection layer stacked on one another sequentially, wherein the electron injection layers of the first color, the second color, and the third color OLED chips are joined with the first electrode layer, and the hole injection layers of the first color, the second color, and the third color OLED chips are joined with the second electrode layer, the third electrode layer, and the fourth electrode layer, respectively.

14. A cuttable OLED light source device, comprising:
a lower substrate;
a plurality of light source layers stacked on one another in a direction perpendicular to a surface of the lower substrate, wherein each of the light source layers includes a plurality of OLED modules arranged in a matrix, and each of the OLED modules includes:
a first electrode layer disposed on the lower substrate;
an OLED chip disposed on the first electrode layer; and
a second electrode layer disposed on the OLED chip;
a partition substrate disposed between the light source layers to separate and connect adjacent light source layers;
a plurality of sensing electrodes disposed on respective OLED modules and electrically connected to the first electrode layer or the second electrode layer for sensing an external magnetic field to provide power to the OLED modules; and
an upper substrate joined on top of the plurality of OLED modules and the sensing electrodes.

15. The cuttable OLED light source device of claim 14, wherein at least one of the sensing electrodes is a ring-shaped, dot-shaped or lattice-like sensing electrode.

16. The cuttable OLED light source device of claim 14, further comprising an insulating layer disposed between the sensing electrodes and the first or the second electrode layer.

17. The cuttable OLED light source device of claim 14, wherein each of the OLED modules includes a package frame structure such that the OLED module has an independent package boundary.

18. The cuttable OLED light source device of claim 14, further comprising cutting lines disposed on at least one of the upper substrate and the lower substrate and corresponding in position to peripheries of the OLED modules.

19. The cuttable OLED light source device of claim 14, wherein at least one of the OLED chip comprises an electron injection layer, an electron transport layer, a light emitting layer, a hole transport layer, and a hole injection layer stacked on one another sequentially, wherein the electron injection layer is joined with the first electrode layer, and the hole injection layer is joined with the second electrode layer.

20. The cuttable OLED light source device of claim 14, wherein the OLED modules in the light source layers are in the same or different matrix arrangement and have the same or different shape and size.

* * * * *